US012787751B2

(12) United States Patent
Wong et al.

(10) Patent No.: US 12,787,751 B2
(45) Date of Patent: Nov. 3, 2026

(54) ON PACKAGE INTERCONNECT ARCHITECTURE FOR HIGH-SPEED MEMORY

(71) Applicant: Intel Corporation, Santa Clara, CA (US)

(72) Inventors: Jooi Wah Wong, Bukit Mertajam (MY); Eng Huat Goh, Ayer Itam (MY); Telesphor Kamgaing, Chandler, AZ (US); Chee Kheong Yoon, Bayan Lepas (MY); Min Suet Lim, Gelugor (MY); Kavitha Nagarajan, Bangalore (IN); Chu Aun Lim, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 171 days.

(21) Appl. No.: 17/833,608

(22) Filed: Jun. 6, 2022

(65) Prior Publication Data

US 2023/0395493 A1 Dec. 7, 2023

(51) Int. Cl.
*H10W 20/41* (2026.01)
*G11C 11/4093* (2006.01)

(52) U.S. Cl.
CPC ....... *H10W 20/435* (2026.01); *G11C 11/4093* (2013.01)

(58) Field of Classification Search
CPC .......................... H10W 20/435; G11C 11/4093
See application file for complete search history.

(56) References Cited

U.S. PATENT DOCUMENTS

| | | | | |
|---|---|---|---|---|
| 6,239,485 | B1 * | 5/2001 | Peters | H05K 1/0219 257/E23.079 |
| 7,531,751 | B2 * | 5/2009 | Hosomi | H01L 23/66 174/250 |
| 7,994,631 | B1 * | 8/2011 | Zhang | H01L 23/055 257/691 |
| 9,111,675 | B1 * | 8/2015 | Kireev | H01F 17/0013 |
| 11,259,403 | B1 * | 2/2022 | Wang | H05K 1/0253 |
| 2017/0286725 | A1 * | 10/2017 | Lewis | G06F 1/206 |

* cited by examiner

*Primary Examiner* — Michael Jung
(74) *Attorney, Agent, or Firm* — Schwabe, Williamson & Wyatt, P.C.

(57) ABSTRACT

Embodiments disclosed herein include package substrates. In an embodiment, a package substrate comprises a core, a first layer on the core, where the first layer comprises a first plane, a second layer on the first layer, where the second layer comprises first traces and second traces arranged in an alternating pattern, a third layer on the second layer, where the third layer comprises third traces and fourth traces arranged in an alternating pattern, and a fourth layer over the third layer, where the fourth layer comprises a second plane.

20 Claims, 7 Drawing Sheets

ON PACKAGE INTERCONNECT ARCHITECTURE FOR HIGH-SPEED MEMORY

TECHNICAL FIELD

Embodiments of the present disclosure relate to electronic packages, and more particularly to packaging architectures that include a DDR routing strategy that allows for a reduction in the layer count of the package substrate.

BACKGROUND

In existing DDR bump pattern design, a total of five package layers are required. This includes two layers for signals and three layers for ground (Vss). This leads to a package substrate with a minimum of ten layers (e.g., in a 4-2-4 design). Such a design is necessary in order to provide a ground plane above and below each of the DDR traces. Since the front side of the package substrate includes five routing layers, the backside of the package substrate will also require an additional set of five routing layers.

It is to be appreciated that an increase in the number of package layers has several drawbacks. One drawback is that the Z-height of the package substrate is increased. Another drawback is that increasing the number of layers increases the cost to manufacture the package substrate. Furthermore, manufacturing complexity is increased and throughput is decreased. Accordingly, it is desirable to decrease the number of layers in the package substrate.

Some solutions may include using an eight layer configuration. In such configurations, there is microstrip routing on the surface and the second layer. That is, the top routing signals have a ground reference below, but do not include a second ground reference above the routing signals. This results in EMI and RFI risk to the DDR signal. Additional solutions may include routing a signal trace on the if core layer. However, this increases the cost of manufacturing the core, and is not desirable.

EMBODIMENTS OF THE PRESENT DISCLOSURE

Described herein are packaging architectures that include a DDR routing strategy that allows for a reduction in the layer count of the package substrate, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1A:
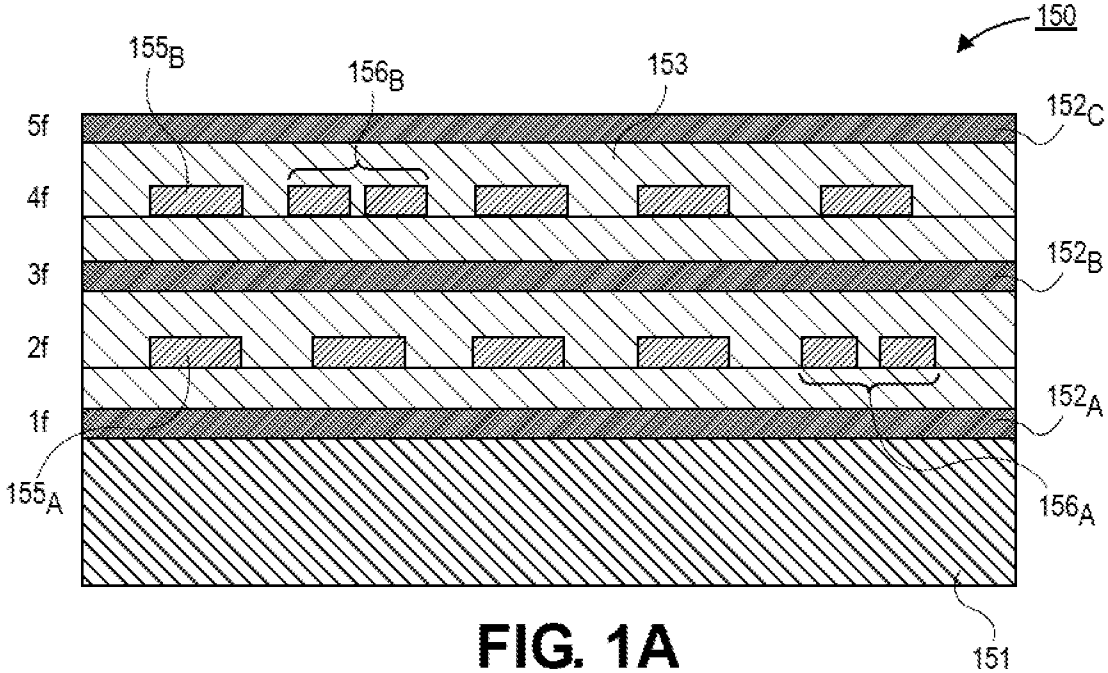
FIG. 1A is a cross-sectional illustration of a package substrate with DDR routing that includes five routing layers on the top of the core.
Figure 1B:
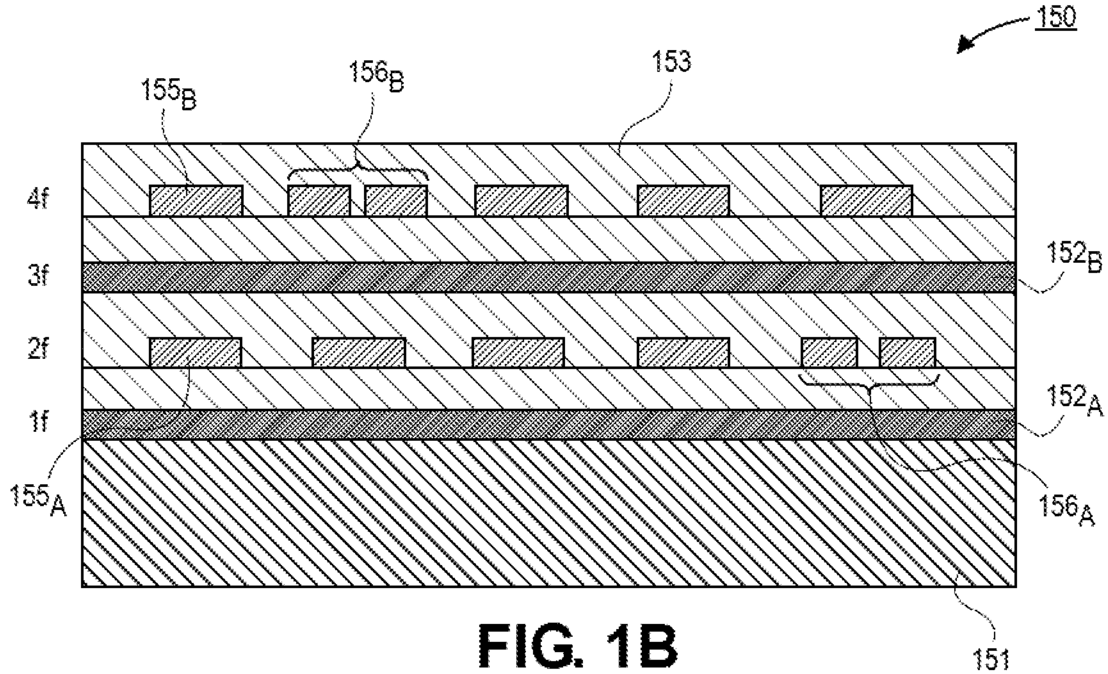
FIG. 1B is a cross-sectional illustration of a package substrate with DDR routing that includes four routing layers on the top of the core.
Figure 1C:
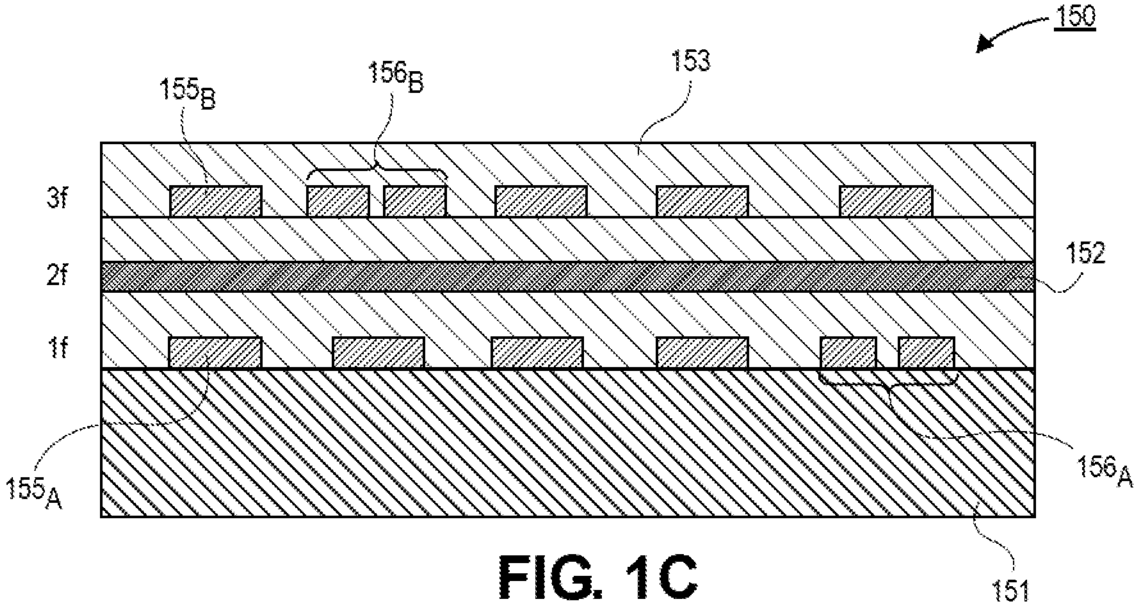
FIG. 1C is a cross-sectional illustration of a package substrate with DDR routing that includes three routing layers on the top of the core with a first routing layer on the core.

Referring now to FIGS. 1A-1C, a series of cross-sectional illustrations depicting package substrates 150 is shown in order to provide context for embodiments disclosed herein. Each of the package substrates 150 only include the routing layers over a top surface of the core 151. Those skilled in the art will appreciate that a matching number of routing layers will be provided below the core 151 as well. For example, when five routing layers are shown over the core 151 (e.g., 1*f*, 2*f*, 3*f*, 4*f*, and 5*f*) a matching number of routing layers (e.g., 1*b*, 2*b*, 3*b*, 4*b*, and 5*b*) will be provided under the core 151.

Referring now to FIG. 1A, a cross-sectional illustration of a package substrate 150 is shown. The package substrate 150 may include a core 151. The core 151 may be an organic material. The organic material may be reinforced with fibers (e.g., glass fibers or the like). A plurality of routing layers may be provided over the top surface of the core 151. For example, routing layers 1*f*-5*f* are illustrated in FIG. 1A. Each routing layer may include conductive planes and/or traces with a buildup layer 153 over the conductive planes and/or traces. For example, conductive planes $\mathbf{152}_A$, $\mathbf{152}_B$, and $\mathbf{152}_C$ may be provided on layers 1*f*, 3*f*, and 5*f*, respectively. In a particular instance, the conductive planes 152 may be configured to be grounded during operation of the package substrate 150.

The ground planes 152 may be used as reference planes for signal traces $\mathbf{155}_A$ and $\mathbf{155}_B$ formed in layers 2*f* and 4*f*. That is, a ground plane 152 is provided both over and under each of the signal traces 155. The signal traces 155 may be used as part of DDR routing between devices (not shown) on the package substrate 150. The signal traces 155 may be single ended signaling traces. In other instances, differential signaling lines $\mathbf{156}_A$ and $\mathbf{156}_B$ may also be provided. The differential signaling lines 156 may comprise a pair of traces that are close together in order to implement differential signaling.

Referring now to FIG. 1B, a cross-sectional illustration of package substrate 150 is shown, in accordance with an additional implementation. Instead of having five routing layers, the package substrate 150 includes four routing layers if to 4*f*. This leads to a package substrate 150 with a total of eight routing layers. The missing routing layer (compared to FIG. 1A) is the top ground plane $\mathbf{152}_C$. Removing the top ground plane $\mathbf{152}_C$ results in a reduction in the cost to manufacture the package substrate 150, and the Z-height of the package substrate 150 can also be reduced.

However, removal of the top ground plane $\mathbf{152}_C$ can result in less effective signal routing. For example, the bottom signal traces $\mathbf{155}_A$ are properly referenced to ground from above and below, but the top signal traces $\mathbf{155}_B$ only have a single ground reference plane $\mathbf{152}_B$ below the signal traces $\mathbf{155}_B$. This results in a signal routing architecture that may be referred to as microstrip routing. Microstrip routing is particularly problematic due to the increase in EMI and RFI risks. Accordingly, additional electrical shielding architectures (not shown) may be required in order to effectively pass signals along signal traces $\mathbf{155}_B$ and differential signaling traces $\mathbf{156}_B$. That is, while Z-height reductions may be provided, such an architecture may not result in a decrease in costs or function at the same level as the package substrate 150 described above with respect to FIG. 1A.

Referring now to FIG. 1C, a cross-sectional illustration of package substrate 150 is shown, in accordance with yet another architecture. In FIG. 1C, a set of three routing layers if 1*f*-3*f* are provided over the core 151. This results in a total of six routing layers. The first routing layer if may include signaling traces $\mathbf{155}_A$ and $\mathbf{156}_A$. The second routing layer 2*f* may include a ground plane 152. The third routing layer 3*f* may include second signaling traces $\mathbf{155}_B$ and $\mathbf{156}_B$. As such, only a single ground plane 152 is provided on the front side surface of the core. First signaling traces $\mathbf{155}_A$ and $\mathbf{156}_A$ may reference the ground plane 152 and another ground plane (not shown) on the backside of the core 151. The second signaling traces $\mathbf{155}_B$ and $\mathbf{156}_B$ may only include a single ground reference 152. That is, the second signaling traces $\mathbf{155}_B$ and $\mathbf{156}_B$ may be microstrip routing architectures.

However, the decrease in Z-height comes at the cost of several drawbacks. A first drawback is that signaling traces $\mathbf{155}_A$ and $\mathbf{156}_A$ are formed on the core 151. While it is possible to form signaling traces on the core 151, such architectures come at a high cost. As such, the cost of fabricating the package substrate is increased. Additionally, the inclusion of microstrip routing increases the EMI and RFI risk of the package substrate 150. As such, additional shielding architectures (not shown) may be needed in order to function as well as the architecture shown in FIG. 1A. The additional shielding architectures may result in an increased cost of the package substrate 150, or result in poorer performance of the DDR signaling.

As noted above, it is desirable to decrease the layer count of the package substrate. However, existing ways to reduce layer count all face significant drawbacks that limit their implementation. Accordingly, embodiments disclosed herein include a DDR routing architecture that allows for a reduction of two layers in the package substrate. This is enabled by removing one of the Vss (ground) layers from the top package layers. A corresponding second layer may be removed from the backside of the package substrate. Particularly, embodiments are able to remove a Vss layer by having two adjacent signaling layers that include alternating ground traces and signal traces. The two layers are also offset from each other so that each DDR signal trace is surround above and below by a ground trace and a ground plane. The traces adjacent to each of the signal traces may also be ground traces. As such, the signal trace is fully surrounded by ground traces without needing an extra layer. Furthermore such architectures may result in improved cross-talk performance between the signaling traces due to the signaling traces being spaced apart by a dielectric layer instead of being adjacent to each other.

Figure 2A:
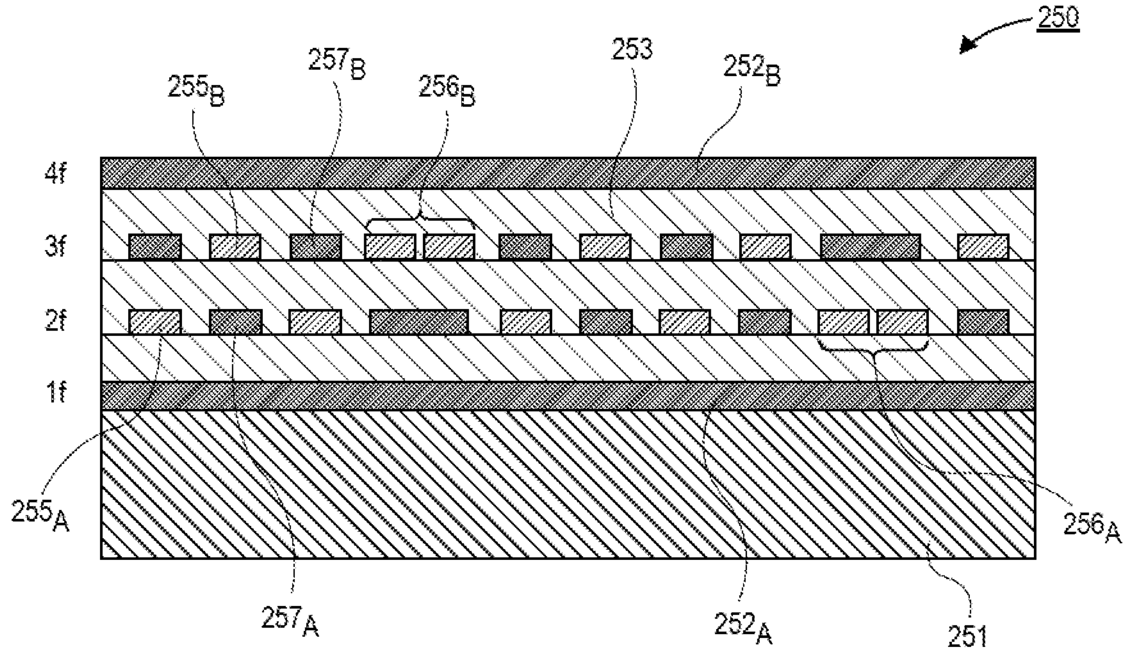
FIG. 2A is a cross-sectional illustration of a package substrate with DDR routing that includes four routing layers with a pair of ground planes on opposite sides of two routing layers with alternating ground traces and signal traces, in accordance with an embodiment.

Referring now to FIG. 2A, a cross-sectional illustration of a package substrate 250 is shown, in accordance with an embodiment. In an embodiment, the package substrate 250 may include a core 251. The core 251 may include an organic material that is reinforced by fibers (e.g., glass fibers). A plurality of routing layers may be provided above and below the core 251. Though, it is to be appreciated that only the top routing layers are shown for simplicity in FIG. 2A. The plurality of routing layers may include four routing layers (1*f*, 2*f*, 3*f*, and 4*f*) in some embodiments. In an embodiment, each routing layer may include conducive traces and/or planes that are covered with a buildup layer 253. The buildup layers 253 may include any suitable organic buildup film. The conductive traces and/or planes may be fabricated with any suitable process, such as a semi-additive process (SAP) or the like. In a particular embodiment, the conductive traces and/or planes may comprise any suitable conductive material such as copper or the like. The conductive traces and/or planes may also include additional layers (not shown) such as barrier layers, adhesion layers, or the like.

In an embodiment, a first ground plane $\mathbf{252}_A$ is provided on the first routing layer 1*f*. The first ground plane 252 serves as a bottom ground reference for first signal traces $\mathbf{255}_A$ and first differential signaling traces $\mathbf{256}_A$ in the second layer 2*f*. The first signaling traces $\mathbf{255}_A$ may be single ended signaling traces in some embodiments. The first differential signaling traces $\mathbf{256}_A$ may include a pair of traces that are used to reference each other in order to implement the differential signaling.

In an embodiment, the first signal traces $\mathbf{255}_A$ and the first differential signaling traces $\mathbf{256}_A$ may be arranged in an alternating pattern with first ground traces $\mathbf{257}_A$. The first ground traces $\mathbf{257}_A$ may also be copper traces substantially similar in composition to the first signal traces $\mathbf{255}_A$. That is, the first ground traces $\mathbf{257}_A$ and the first signal traces $\mathbf{255}_A$ may look substantially similar to each other in some embodiments. The difference between the two features may be determined by looking at the bumps to which the features are connected. For example, the first signal traces $\mathbf{255}_A$ will be electrically coupled to signaling bumps, and the first ground traces $\mathbf{257}_A$ may be electrically coupled to ground bumps, a ground plane, or any other feature configured to be grounded. Additionally, while shown as having the same dimensions as the first signal traces $\mathbf{255}_A$, the first ground traces $\mathbf{257}_A$ may have different dimensions than the first signal traces $\mathbf{255}_A$ in some embodiments. For example, the first ground trace $\mathbf{257}_A$ below the second differential signaling trace $256_B$ in the third layer 3*f* may be wider than the first signal traces $255_A$ in the second layer 2*f*.

In an embodiment, second signal traces $255_B$ and $256_B$ may be provided in the third routing layer 3*f*. That is, the first signal traces $255_A$ and the second signal traces $255_B$ may be separated vertically by only a portion of a buildup layer 253 without a ground plane between them. In an embodiment, the second signal traces $255_B$ and $256_B$ may also be positioned in an alternating pattern with second ground traces 257B. That is, the left and right sides of the second signal traces $255_B$ and $256_B$ may face grounded features.

The second ground traces 257B may also be copper traces substantially similar in composition to the second signal traces $255_B$. That is, the second ground traces 257B and the second signal traces $255_B$ may look substantially similar to each other in some embodiments. The difference between the two features may be determined by looking at bumps to which the features are connected. For example, the second signal traces $255_B$ will be electrically coupled to signaling bumps, and the second ground traces 257B may be electrically coupled to ground bumps, a ground plane, or any other feature configured to be grounded. Additionally, while shown as having the same dimensions as the second signal traces $255_B$, the second ground traces 257B may have different dimensions than the second signal traces $255_B$ in some embodiments. For example, the second ground trace 257B above the first differential signaling trace $256_A$ in the second layer 2*f* may be wider than the second signal traces $255_B$ in the third layer 3*f*.

In an embodiment, the second signal traces $255_B$ and $256_B$ may be offset from the first signal traces $255_A$ and $256_A$. As such, each second signal trace $255_B$ and $256_B$ may be aligned with an underlying first ground trace $257_A$. Similarly, each first signal trace $255_A$ and $256_A$ may be aligned with an overlying second ground trace 257B. In an embodiment, a second ground plane 252B may be provided in the fourth layer 4*f* above the second signal traces $255_B$ and $256_B$. Accordingly, each surface of the first signal traces $255_A$ and $256_A$ are facing a grounded feature (e.g., the first ground plane $252_A$ below, a second ground trace 257B above, and first ground traces $257_A$ on either side). Similarly, each surface of the second signal traces $255_B$ and $256_B$ are facing a grounded feature (e.g., the second ground plane 252B above, a first ground trace $257_A$ below, and second ground traces 257B on either side). Therefore, each of the first signal traces $255_A$ and $256_A$ and the second signal traces $255_B$ and $256_B$ are provided in a stripline routing architecture without the need for an extra fifth layer. This reduces costs, improves throughput, reduces Z-height, and maintains high signal integrity without EMI or RFI issues.

Figure 2B:
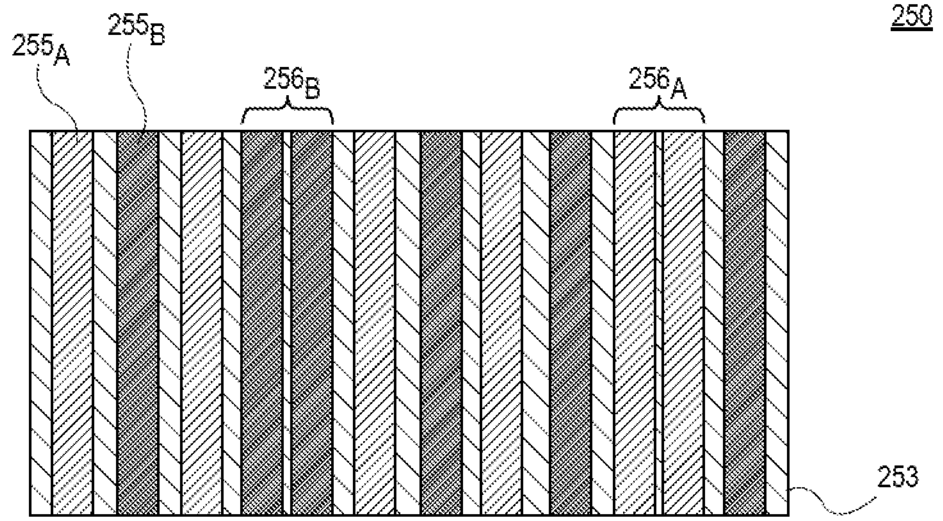
FIG. 2B is a plan view illustration of the package substrate that illustrates the alternating pattern of first signal traces and second signal traces, in accordance with an embodiment.

Referring now to FIG. 2B, a plan view illustration of a package substrate 250 is shown, in accordance with an embodiment. In the illustration of FIG. 2B, both the second layer 2*f* and the third layer 3*f* are shown. The first ground traces and the second ground traces are omitted in order to simplify the Figure. The dielectric buildup layer 253 is provided around the traces illustrated in FIG. 2B. As shown, the first signal traces $255_A$ and the second signal traces $255_B$ are provided in an alternating pattern. Similarly, the first differential signaling traces $256_A$ and the second differential signaling traces $256_B$ are inserted into the alternating pattern. That is, for each differential signaling trace a pair of two traces will be immediately adjacent to each other, and neighboring traces to the pair will be of the opposite type. For example, a first differential signaling trace $256_A$ will have two traces in the second layer, and the pair will be immediately adjacent to second signal traces $256_B$ in the third layer. It is to be appreciated that ground traces (not shown) are provided directly above each of the first signal traces $255_A$, and ground traces (not shown) are provided directly below each of the second signal traces $255_B$.

The region of the package substrate 250 shown in FIG. 2B is after the breakout region. Once out of the breakout region, the first signal traces $255_A$ and the second signal traces $255_B$ remain in the alternating pattern shown in FIG. 2B. However, it is to be appreciated that in some instances there may be some overlap between first signal traces $255_A$ and second signal traces $255_B$ (or differential signal traces $256_A$ and $256_B$) in the breakout region of the package substrate 250.

Figure 3:
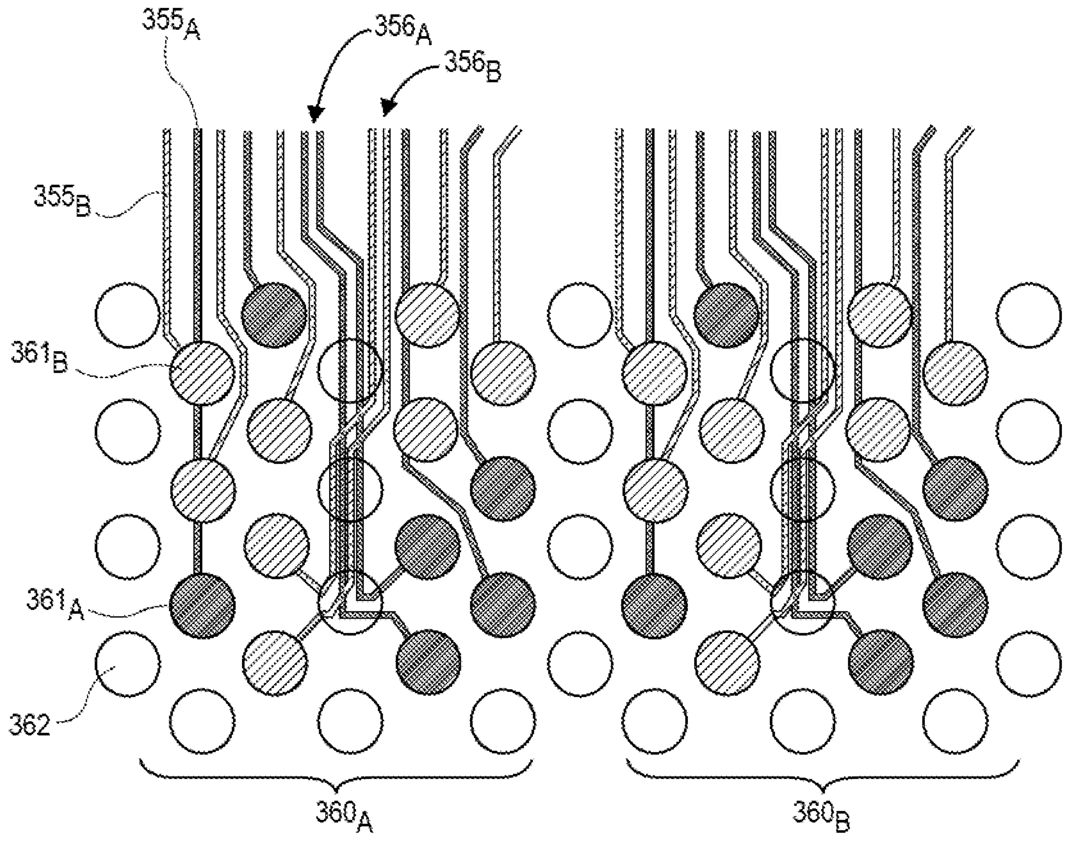
FIG. 3 is a plan view illustration of the breakout region for a pair of DDR DQ bytes, in accordance with an embodiment.

Referring now to FIG. 3, a plan view illustration of a breakout region of DDR signaling is shown, in accordance with an embodiment. In the illustration of FIG. 3, the second layer 2*f* and the third layer 3*f* are shown with the third layer being a first shading and the second layer 2*f* being a second shading. For example, vias 361A extend down to the second layer 2*f*, and vias 361E extend down to the third layer 3*f*. As shown, first signal traces 355A extend out from the vias 361A, and second signal traces 355B extend out from the vias 361B. Similarly, differential signal traces 356A extend out from vias 361A, and different signal traces 356B extend out from vias 361B. In an embodiment, vias 362 may be ground vias. For example, the ground vias 362 may be connected to ground planes, ground traces, or the like. The ground vias 362 are shown unfilled in order to not obscure the Figure.

In an embodiment, portions of the first signal traces 355A and the second signal traces 355B may overlap each other in some implementations of the breakout region. Additionally, the differential signaling pairs 356A and 356B may sometimes overlap with each other or other signal traces 355. As will be described in greater detail below, the overlapping nature of the breakout region does not negatively impact embodiments described herein. For example, cross-talk between overlapping features is negligible compared to existing routing architectures.

In the illustrated embodiment, a pair of DDR DQ bytes 360A and 360B are provided. The individual bytes 360 may be arranged laterally adjacent to each other in some embodiments. The laterally adjacent architecture allows for the DDR DQ bytes 360 to be separated from each other without any overlap.

Figure 4A:
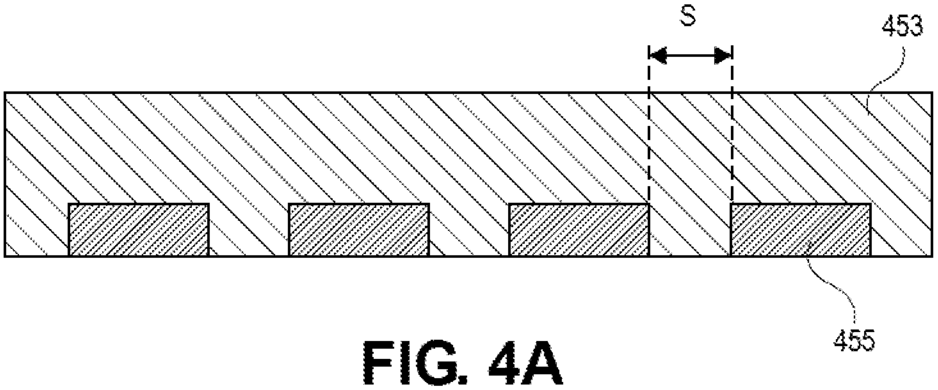
FIG. 4A is a cross-sectional illustration of signal traces in a single layer of a package substrate that are spaced at a minimum spacing, in accordance with an embodiment.

Referring now to FIG. 4A, a cross-sectional illustration of a dielectric buildup layer 453 is shown, in accordance with an embodiment. As shown, a set of signal traces 455 are embedded in the dielectric buildup layer 453. The layers above and below the dielectric buildup layer 453 are omitted for simplicity. As shown, the signal traces 455 may be spaced apart from each other by a spacing S. The spacing S may be approximately 20 μm or smaller or approximately 12 μm or smaller. As used herein, "approximately" may refer to a range of values that are within ten percent of the stated value. For example, approximately 20 μm may refer to a range from 18 μm to 22 μm. Such spacings are currently available in many package substrate designs. Accordingly, it has been shown that cross-talk between such closely spaced features is not a significant detriment to the signaling effectiveness.

Figure 4B:
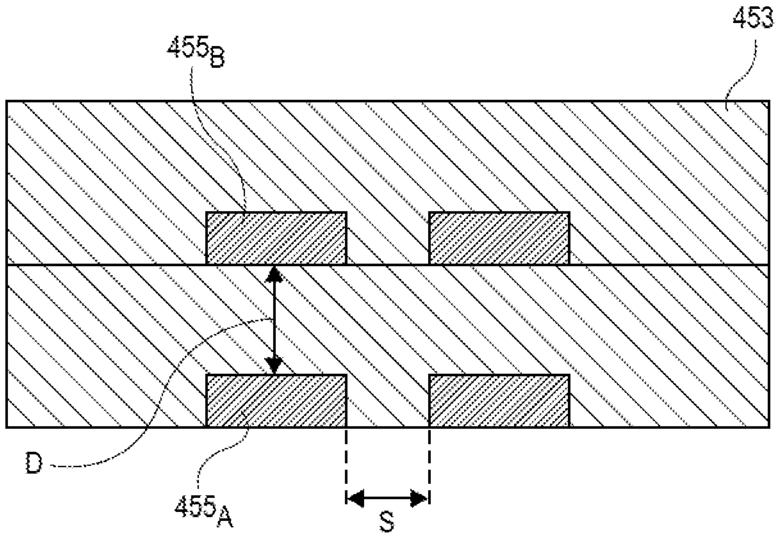
FIG. 4B is a cross-sectional illustration of signal traces in a pair of layers of a package substrate that have the minimum spacing within a layer and a spacing between layers that is greater than the minimum spacing, in accordance with an embodiment.

As noted above, there may be some cross-over between signal traces in the breakout region of the package substrate. However, it is to be appreciated that such cross-over does not result in any significant cross-talk between the signals. For example, FIG. 4B is a cross-sectional illustration of a portion of first signal traces $455_A$ and second signal traces $455_B$ that overlap each other in the breakout region. As shown, the first signal traces $455_A$ may be separated from each other by a spacing S. Similarly, the second signal traces $455_B$ may be separated from each other by the spacing S. The spacing S may be approximately 20 μm or smaller or approximately 12 μm or smaller.

Additionally, the first signal traces $455_A$ may be spaced apart from the second signal traces $455_B$ by a distance D. The distance D may be greater than the spacing S. For example, the distance D may be approximately 20 μm or greater in some embodiments. Additionally, the dielectric material in the dielectric buildup layer 453 is provided between the different layers of the signal traces 455. Since the same material is provided between the signal traces $455_A$ and $455_B$, and the distance D is greater than the spacing S, the cross-talk between the first signal traces $455_A$ and the overlying second signal traces $455_B$ can be presumed to be less than the cross-talk seen in existing architectures. Accordingly, overlapping signal traces in the breakout region do not negatively impact the electrical signaling effectiveness of the package substrate.

Figure 5:
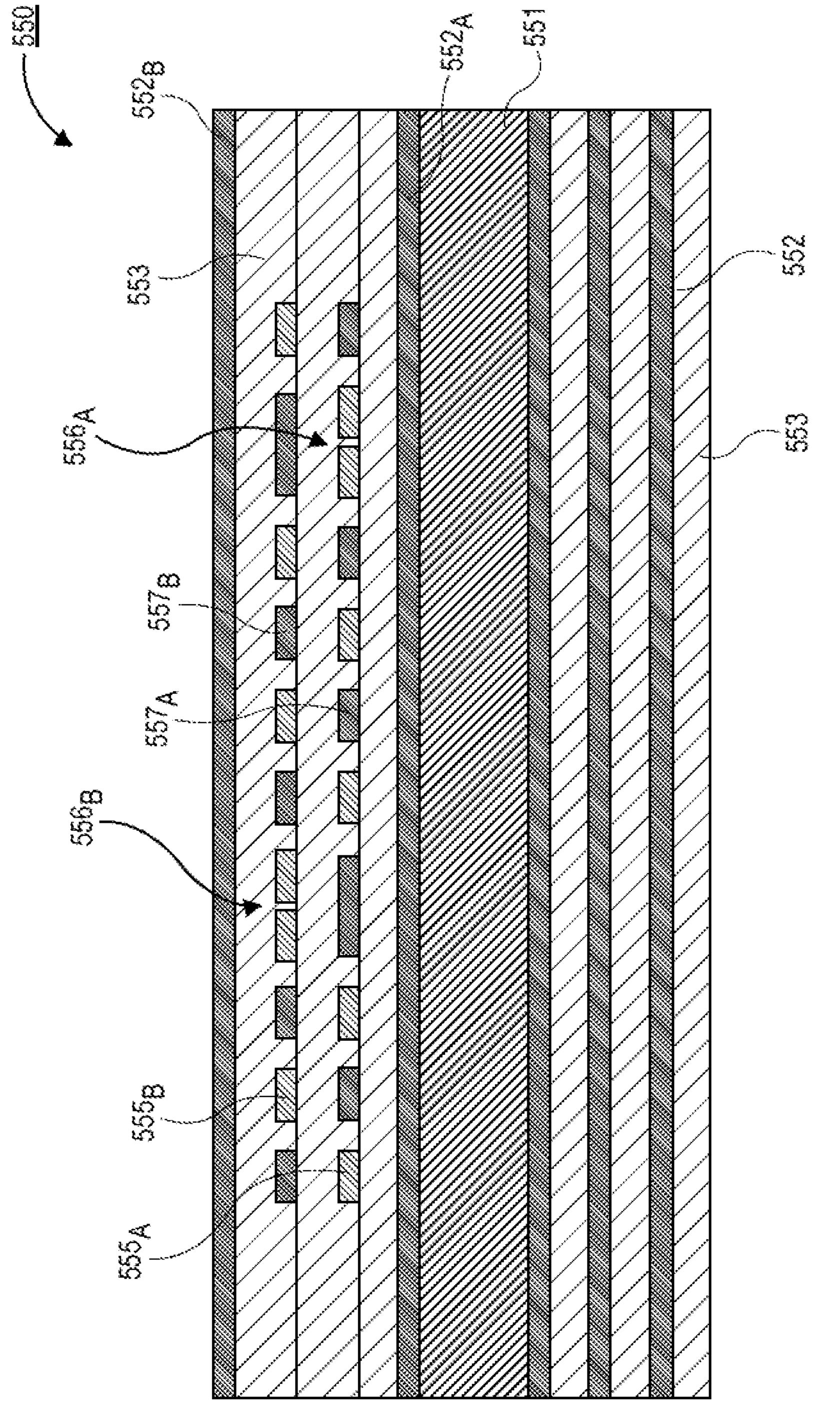
FIG. 5 is a cross-sectional illustration of a package substrate with eight routing layers and DDR routing that includes a first signal routing layer and a second signal routing layer, in accordance with an embodiment.

Referring now to FIG. 5, a cross-sectional illustration of a package substrate 550 is shown, in accordance with an embodiment. As shown, the package substrate 550 may include a core 551. The core 551 may be an organic material that is reinforced with fibers (e.g., glass fibers or the like). In an embodiment, routing layers may be provided above and below the core 551. For example, four routing layers are provided over the core 551 and four routing layers 552 are provided below the core 551. As such, a total of eight routing layers are provided. Dielectric buildup layers 553 may be provided between routing layers.

In an embodiment, the top four routing layers may be used in order to provide DDR routing between devices (not shown) on the package substrate 550. In an embodiment, the DDR routing is implemented as stripline routing with only four routing layers, compared to the need for five routing layers, as described in greater detail above. A first routing layer may comprise a first ground plane $552_A$. The fourth routing layer may comprise a second ground plane $552_B$. Signal routing layers may be provided on the second routing layer and the third routing layer.

In an embodiment, the second routing layer may include first signal traces $555_A$ and first differential signaling traces $556_A$. The first signal traces $555_A$ and the first differential signaling traces $556_A$ may be arranged in an alternating pattern with first ground traces $557_A$. In an embodiment, the third routing layer may include second signal traces $555_B$ and second differential signaling traces $556_B$. The second signal traces $555_B$ and the second differential signaling traces $556_B$ may be arranged in an alternating pattern with second ground traces $557_B$. In an embodiment, the first signal traces $555_A$ and the second signal traces $555_B$ may be offset from each other. This allows for a second ground trace $557_B$ to be provided directly above the first signal traces $555_A$ and a first ground trace $557_A$ to be provided directly below the second signal traces $555_B$. Accordingly, each signal trace 555 or 556 is fully shielded by ground features on each surface in order to enable full stripline routing architectures within only four routing layers.

Figure 6:
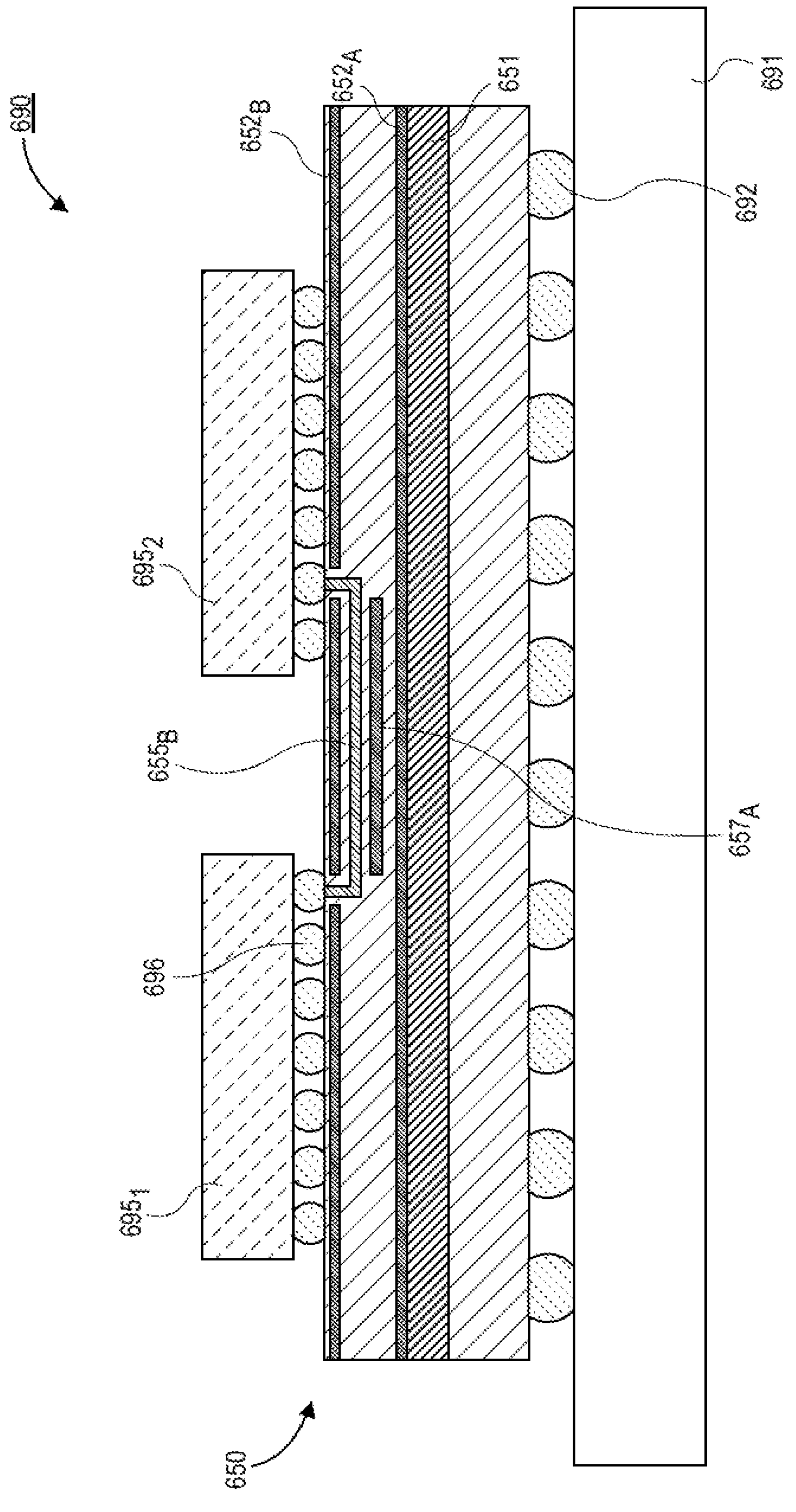
FIG. 6 is a cross-sectional illustration of an electronic system with a package substrate that includes DDR routing, in accordance with an embodiment.

Referring now to FIG. 6, a cross-sectional illustration of an electronic system 690 is shown, in accordance with an embodiment. In an embodiment, the electronic system 690 may include a board 691, such as a printed circuit board (PCB). In an embodiment, the board 691 may be coupled to a package substrate 650 by interconnects 692. For example, the interconnects 692 may be solder balls or the like. One or more dies 695 may be coupled to the package substrate 650 by interconnects 696. For example, solder balls or the like may be used as the interconnects 696. In the illustrated embodiment, a pair of dies $695_1$ and $695_2$ are provided. For example, the first die $695_1$ may be a memory die and the second die $695_2$ may be a compute die, such as a central processing unit (CPU), a graphics processing unit (GPU), a system on a chip (SoC), or the like. Additionally, the memory die $695_1$ may comprise a stack of a plurality of memory dies that are coupled to the package substrate.

In an embodiment, the package substrate 650 may include a core 651. Routing layers may be provided above and below the core 651. For example, four routing layers are shown above the core in FIG. 6. A first ground plane $652_A$ may be provided in the first routing layer. A ground trace $657_A$ may be provided in the second routing layer. A signal trace $655_B$ may be provided in the third routing layer, and a second ground plane $652_B$ may be provided in the fourth routing layer. While a single signal trace $655_B$ is shown, it is to be appreciated that additional signal traces 655 may be provided in both the second routing layer and the third routing layer. For example, offset signal traces 655 may be provided in the second and third routing layers, similar to embodiments described in greater detail above. Particularly, the package substrate 650 may be similar to any of the package substrates in accordance with embodiments described herein. In an embodiment, the signal traces 655 may provide DDR routing between the first die $695_1$ and the second die $695_2$.

Figure 7:
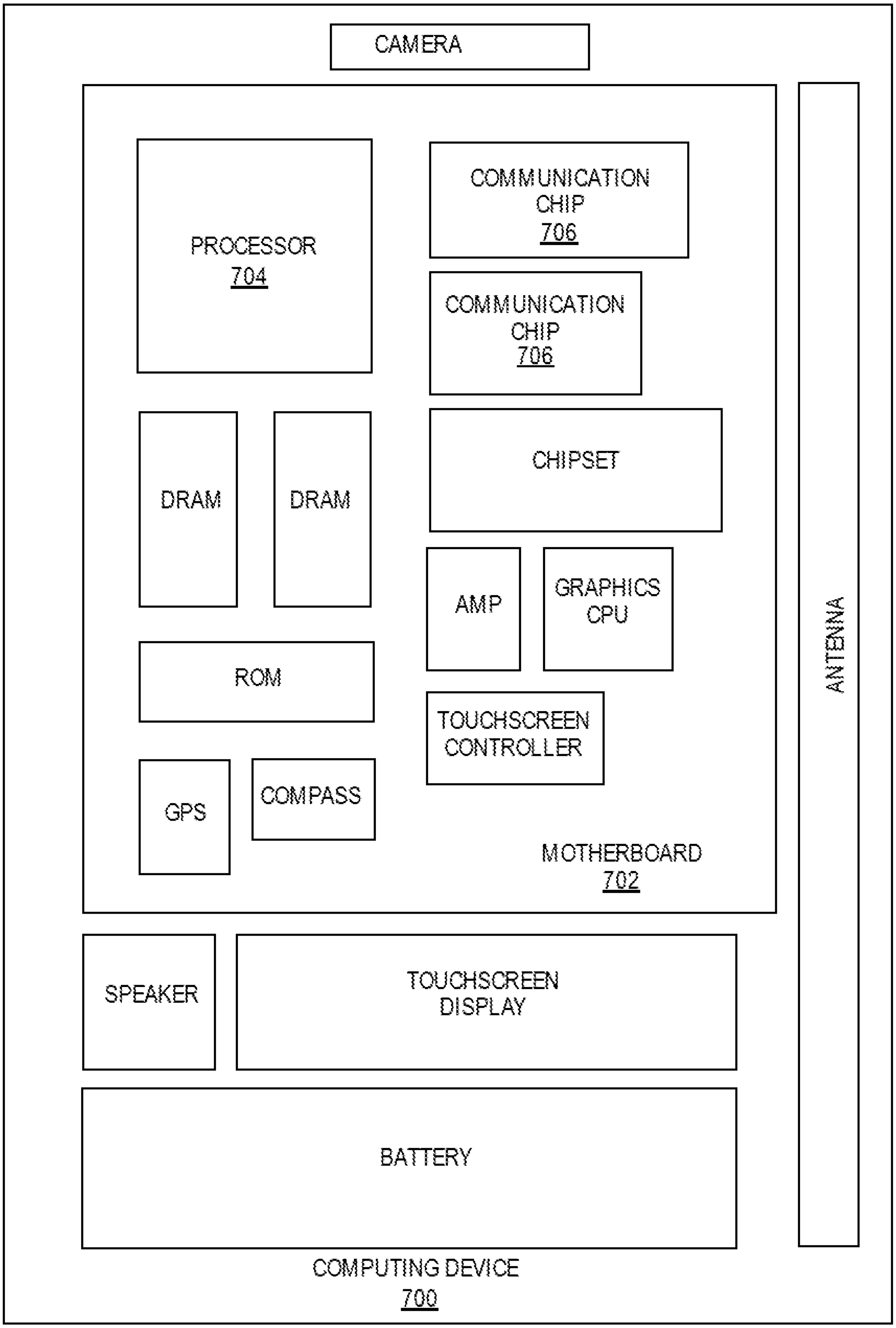
FIG. 7 is a schematic of a computing device built in accordance with an embodiment.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor may be part of an electronic package that includes a package substrate with stripline DDR architectures implemented in four routing layers, in accordance with embodiments described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip may be part of an electronic package that includes a package substrate with stripline DDR architectures implemented in four routing layers, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a package substrate, comprising: a core; a first layer on the core, wherein the first layer comprises a first plane; a second layer on the first layer, wherein the second layer comprises first traces and second traces arranged in an alternating pattern; a third layer on the second layer, wherein the third layer comprises third traces and fourth traces arranged in an alternating pattern; and a fourth layer over the third layer, wherein the fourth layer comprises a second plane.

Example 2: the package substrate of Example 1, wherein the first traces are configured to be first signaling traces and the second traces are configured to be first ground traces, and wherein the third traces are configured to be second signaling traces and the fourth traces are configured to be second ground traces.

Example 3: the package substrate of Example 2, wherein the second signal traces are aligned over the first ground traces, and wherein the second ground traces are aligned over the first signal traces.

Example 4: the package substrate of Example 3, wherein four faces of each first signal trace faces a grounded surface.

Example 5: the package substrate of Example 3 or Example 4, wherein four faces of each second signal trace faces a grounded surface.

Example 6: the package substrate of Examples 2-5, wherein the first signal traces include single ended signaling traces.

Example 7: the package substrate of Example 6, wherein the first signal traces further included differential signaling traces.

Example 8: the package substrate of Example 7, wherein a pair of differential signaling traces are adjacent to each other and provided between first ground traces.

Example 9: the package substrate of Example 7 or Example 8, wherein the differential signaling traces are both aligned with a single second ground trace.

Example 10: the package substrate of Examples 2-9, wherein the first signal traces and the second signal traces are part of a single DDR byte.

Example 11: the package substrate of Examples 2-10, wherein overlap of the first signal traces and the second signal traces only occurs at a bump breakout region.

Example 12: the package substrate of Examples 1-11, wherein the package substrate further comprises four routing layers on an opposite side of the core from the first layer.

Example 13: the package substrate of Examples 1-12, wherein a dielectric layer is provided between the second layer and the third layer.

Example 14: the package substrate of Example 13, wherein a thickness of the dielectric layer is greater than 12 μm.

Example 15: an electronic package, comprising: a package substrate; a first die on the package substrate; a second die on the package substrate, wherein the first die is communicatively coupled to the second die by a DDR byte on the package substrate, wherein the DDR byte comprises: a first signaling layer that includes first signal traces and first ground traces arranged in an alternating pattern; and a second signaling layer over the first signaling layer, wherein the second signaling layer includes second signal traces and second ground traces arranged in an alternating pattern.

Example 16: electronic package of Example 15, wherein the first signal traces are aligned under the second ground traces, and wherein the second signal traces are aligned over the first ground traces.

Example 17: the electronic package of Example 15 or Example 16, further comprising: a first ground plane under the first signaling layer; and a second ground plane over the second signaling layer.

Example 18: the electronic package of Example 17, wherein four faces of a first signaling trace each face a grounded surface.

Example 19: the electronic package of Examples 15-18, wherein the package substrate comprises eight routing layers.

Example 20: the electronic package of Examples 15-19, wherein the first die is a compute die, and wherein the second die is a memory die.

Example 21: the electronic package of Examples 15-20, further comprising: a plurality of DDR bytes in the package substrate, wherein the plurality of DDR bytes are adjacent to each other.

Example 22: the electronic package of Examples 15-21, wherein at least one of the first signal traces and/or the second signal traces is a differential signaling pair.

Example 23: the electronic package of Example 22, wherein the differential signaling pair are adjacent to each other, and wherein the differential signaling pair are aligned over or under a single one of the first ground traces or a single one of the second ground traces.

Example 24: an electronic system, comprising: a board; a package substrate coupled to the board, wherein the package substrate comprises: eight routing layers with a DDR byte occupying four of the routing layers, wherein the DDR byte comprises: a first plane; a second plane; a first routing layer with first traces between the first plane and the second plane; and a second routing layer with second traces between the first plane and the second plane, wherein the first traces are offset from the second traces; and a die coupled to the package substrate.

Example 25: the electronic system of Example 24, wherein the first traces are alternated with first ground traces, and wherein the second traces are alternated with second ground traces.

What is claimed is:

1. A package substrate, comprising:

a core;

a first layer on the core, wherein the first layer comprises a first plane;

a second layer on the first layer, wherein the second layer comprises first traces and second traces arranged in an alternating pattern;

a third layer on the second layer, wherein the third layer comprises third traces and fourth traces arranged in an alternating pattern, wherein there are no additional layers between the third layer and the second layer; and a fourth layer over the third layer, wherein the fourth layer comprises a second plane.

2. The package substrate of claim 1, wherein the first traces are configured to be first signaling traces and the second traces are configured to be first ground traces, and wherein the third traces are configured to be second signaling traces and the fourth traces are configured to be second ground traces.

3. The package substrate of claim 2, wherein the second signal traces are aligned over the first ground traces, and wherein the second ground traces are aligned over the first signal traces.

4. The package substrate of claim 3, wherein four faces of each first signal trace faces a grounded surface.

5. The package substrate of claim 3, wherein four faces of each second signal trace faces a grounded surface.

6. The package substrate of claim 2, wherein the first signal traces include single ended signaling traces.

7. The package substrate of claim 6, wherein the first signal traces further included differential signaling traces.

8. The package substrate of claim 7, wherein a pair of differential signaling traces are adjacent to each other and provided between first ground traces.

9. The package substrate of claim 7, wherein the differential signaling traces are both aligned with a single second ground trace.

10. The package substrate of claim 2, wherein the first signal traces and the second signal traces are part of a single byte.

11. The package substrate of claim 2, wherein overlap of the first signal traces and the second signal traces only occurs at a bump breakout region.

12. The package substrate of claim 1, wherein the package substrate further comprises four routing layers on an opposite side of the core from the first layer.

13. The package substrate of claim 1, wherein a dielectric layer is provided between the second layer and the third layer.

14. The package substrate of claim 13, wherein a thickness of the dielectric layer is greater than 12 μm.

15. A package substrate, comprising:

a core;

a first layer on the core, wherein the first layer comprises a first plane;

a second layer on the first layer, wherein the second layer comprises first traces and second traces arranged in an alternating pattern;

a third layer on the second layer, wherein the third layer comprises third traces and fourth traces arranged in an alternating pattern; and a fourth layer over the third layer, wherein the fourth layer comprises a second plane, wherein the first traces are configured to be first signaling traces and the second traces are configured to be first ground traces, and wherein the third traces are configured to be second signaling traces and the fourth traces are configured to be second ground traces, wherein the second signal traces are aligned over the first ground traces, and wherein the second ground traces are aligned over the first signal traces.

16. The package substrate of claim 15, wherein four faces of each first signal trace faces a grounded surface.

17. The package substrate of claim 15, wherein four faces of each second signal trace faces a grounded surface.

18. A package substrate, comprising:

a core;

a first layer on the core, wherein the first layer comprises a first plane;

a second layer on the first layer, wherein the second layer comprises first traces and second traces arranged in an alternating pattern;

a third layer on the second layer, wherein the third layer comprises third traces and fourth traces arranged in an alternating pattern; and a fourth layer over the third layer, wherein the fourth layer comprises a second plane, wherein the first traces are configured to be first signaling traces and the second traces are configured to be first ground traces, and wherein the third traces are configured to be second signaling traces and the fourth traces are configured to be second ground traces, wherein the first signal traces include single ended signaling traces, and wherein the first signal traces further included differential signaling traces.

19. The package substrate of claim 18, wherein a pair of differential signaling traces are adjacent to each other and provided between first ground traces.

20. The package substrate of claim 19, wherein the differential signaling traces are both aligned with a single second ground trace.

* * * * *